United States Patent
Cical et al.

(10) Patent No.: US 8,519,771 B1
(45) Date of Patent: Aug. 27, 2013

(54) METHODS AND APPARATUS FOR RECEIVING HIGH AND LOW VOLTAGE SIGNALS USING A LOW SUPPLY VOLTAGE TECHNOLOGY

(75) Inventors: Ionut Cical, Dublin (IE); Edward Cullen, Clane (IE); Chandrika Durbha, Dublin (IE)

(73) Assignee: Xilinx, Inc., San Jose, CA (US)

( * ) Notice: Subject to any disclaimer, the term of this patent is extended or adjusted under 35 U.S.C. 154(b) by 148 days.

(21) Appl. No.: 12/975,634

(22) Filed: Dec. 22, 2010

(51) Int. Cl.
*H03K 17/687* (2006.01)

(52) U.S. Cl.
USPC .......................................... 327/427; 327/108

(58) Field of Classification Search
USPC .......................................... 327/427, 108, 112
See application file for complete search history.

(56) References Cited

U.S. PATENT DOCUMENTS

| | | | |
|---|---|---|---|
| 6,815,984 B1 * | 11/2004 | Bowers et al. | 327/112 |
| 2010/0176848 A1 * | 7/2010 | Du et al. | 327/108 |
| 2011/0026173 A1 * | 2/2011 | Karp | 361/56 |

* cited by examiner

*Primary Examiner* — Lincoln Donovan
*Assistant Examiner* — Diana J Cheng
(74) *Attorney, Agent, or Firm* — Kin-Wah Tong; LeRoy D. Maunu

(57) ABSTRACT

Methods and apparatus for receiving high voltage signals using a receiver designed in a low supply voltage technology are disclosed. One embodiment of an integrated circuit includes a single ended driver including an n-type metal-oxide-semiconductor (NMOS) transistor and a p-type metal-oxide-semiconductor (PMOS) transistor. An input pass gate is coupled to the single ended driver, and is configured as a PMOS pass gate coupled in parallel with the NMOS transistor in the single ended driver. In a low voltage mode, the NMOS transistor and the PMOS pass gate form a first pass gate for transmitting the input signal to the receiver. In a high voltage mode, the PMOS pass gate is disabled, and the NMOS transistor and PMOS transistor form a second pass gate for transmitting the input signal to the receiver.

15 Claims, 4 Drawing Sheets

METHODS AND APPARATUS FOR RECEIVING HIGH AND LOW VOLTAGE SIGNALS USING A LOW SUPPLY VOLTAGE TECHNOLOGY

FIELD OF THE DISCLOSURE

This disclosure relates generally to integrated circuits, and relates more particularly to techniques for receiving high and low voltage signals using low supply voltage integrated circuit technology.

BACKGROUND

One conventional way of receiving 3.3V input signals in 1.8V integrated circuit technology is to use an n-type metal-oxide-semiconductor (NMOS) device to down level-shift the input signal so that it does not damage the receiver (which is designed using a 1.8V technology, i.e., the receiver is adapted to deal with 1.8V input signals without damage). FIG. 1, for example, is a schematic diagram illustrating a portion of an exemplary integrated circuit 100 in which a pass gate 102 (e.g., an NMOS transistor) is placed in the current path between an input/output (IO) pad 104 and a receiver (RX) 106. The IO pad receives an input signal of 3.3V, while the receiver 106 is designed to receive a high voltage of no more than 1.8V. The gate of the NMOS transistor is connected to a bias voltage (bias) that ensures that no devices see more than the reliability limit of 1.8V on the terminals.

This solution, however, has trouble supporting the low voltage differential signaling (LVDS) standard. For instance, the pass gate 102 cannot drive the input signal to the receiver when the input signal is a high common-mode signal or a low voltage complementary metal-oxide-semiconductor 18 (LVCMOS18) signal. One conventional way to solve this problem is to add a PMOS device to the pass gate in parallel with the NMOS device. FIG. 2, for example, is a schematic diagram illustrating a portion of an exemplary integrated circuit 200 in which a pass gate 202 (i.e., an NMOS transistor in parallel with a PMOS transistor) is placed in the current path between an IO pad 204 and a receiver (RX) 206. Both the NMOS and PMOS transistors are turned on only when supporting standards of 1.8V and below, while the PMOS transistor is turned off when the receiving standard is higher than 1.8V.

SUMMARY

Methods and apparatus for receiving high and low voltage signals using a low supply voltage technology are disclosed. One embodiment of an integrated circuit includes a single ended driver comprising a first n-type metal-oxide-semiconductor (NMOS) transistor and a first p-type metal-oxide-semiconductor (PMOS) transistor. The single ended driver is coupled to receive an input signal. In addition, the integrated circuit includes an input pass gate configured as a PMOS pass gate and coupled in parallel with the first NMOS transistor. In a low voltage mode, the first NMOS transistor and the PMOS pass gate form a first pass gate for transmitting the input signal to a receiver. In a high voltage mode, the PMOS pass gate is disabled, and the first NMOS transistor and the first PMOS transistor form a second pass gate for transmitting the input signal to the receiver.

In various embodiments of the integrated circuit, the input signal is received via an input/output (IO) pad integrated in the single ended driver; the single ended driver further includes a second PMOS transistor coupled directly to a supply voltage source and a second NMOS transistor coupled directly to ground, wherein the second PMOS transistor, the first PMOS transistor, the first NMOS transistor, and the second NMOS transistor are coupled in series; the first PMOS transistor is coupled to a first bias voltage source; the first NMOS transistor is coupled to a second bias voltage source; the input pass gate includes a third PMOS transistor coupled to the IO pad and a fourth PMOS transistor coupled between the third PMOS transistor and the receiver; a gate of the fourth PMOS transistor is coupled to receive an enable signal selecting between the low voltage mode and the high voltage mode; the integrated circuit further includes a fifth PMOS transistor coupled to the IO pad, a third NMOS transistor, and a fourth NMOS transistor coupled directly to ground, wherein the fifth PMOS transistor, the third NMOS transistor, and the fourth NMOS transistor are coupled in series; the fifth PMOS transistor and the third NMOS transistor are coupled to a second bias voltage source; and/or a gate of the fourth NMOS transistor is coupled to receive an enable signal selecting between the low voltage mode and the high voltage mode.

According to another embodiment, a first method for transmitting an input signal through an input circuit from an input/output (IO) pad to a receiver is provided. The method includes: selecting a high voltage transmission mode for the input circuit; receiving the input signal at the IO pad, wherein the IO pad is integrated in a single ended driver; and transmitting the input signal from the IO pad to the receiver via a first signal path through the input circuit. The first signal path comprises a pass gate integrated in the single ended driver.

In various embodiments of the method, the receiver is designed using a 1.8V technology, while the input signal exceeds 1.8V; the pass gate comprises an NMOS transistor and a PMOS transistor; the single ended driver comprises the NMOS transistor and the PMOS transistor, each having a source/drain coupled to the IO pad; and/or the selecting comprises disabling a second signal path through the input circuit, the second signal path being coupled between the IO pad and the receiver.

According to another embodiment, a second method for transmitting an input signal through an input circuit from an IO pad to a receiver is provided. The method includes selecting a low voltage transmission mode for the input circuit; receiving the input signal at the IO pad, wherein the IO pad is integrated in a single ended driver; and transmitting the input signal from the IO pad to the receiver via first and second signal paths through the input circuit. The first signal path comprises a first pass gate integrated into the single ended driver. The second signal path comprises a second pass gate coupled between the IO pad and the receiver.

BRIEF DESCRIPTION OF THE DRAWINGS

Accompanying drawings show exemplary embodiments in accordance with one or more aspects of the disclosure. However, the accompanying drawings should not be taken to limit the disclosure to the embodiments shown, but are for explanation and understanding only.

DETAILED DESCRIPTION

In one embodiment, methods and apparatus for receiving high and low voltage signals using a receiver designed using a low supply voltage technology are disclosed. Specifically, one described embodiment provides a way of receiving input signals in the range of 1.2V to 3.3V amplitude in 1.8V integrated circuit technology with protection against over and undershoots. It is noted that within the context of the disclosure, numerical terms such as "first," "second," "third," and the like are used to refer to various elements such as transistors and bias voltages. These terms are used solely as labels meant to differentiate among the elements, and do not necessarily imply a total quantity of elements. For instance, the term "third NMOS transistor" does not necessarily imply that first and second NMOS transistors exist.

Figure 1:
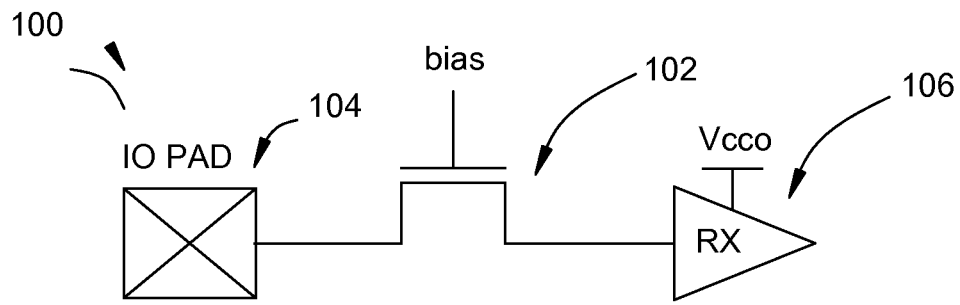
FIG. 1 is a schematic diagram illustrating a portion of an exemplary integrated circuit in which a pass gate (i.e., an NMOS transistor) is placed in the current path between an input/output (IO) pad and a receiver.
Figure 2:
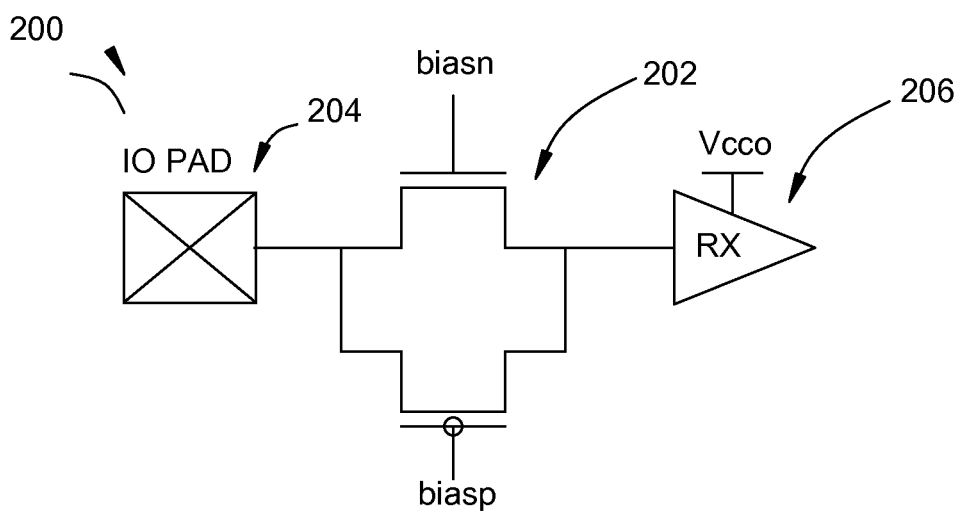
FIG. 2 is a schematic diagram illustrating a portion of an exemplary integrated circuit in which a pass gate (i.e., an NMOS transistor in parallel with a PMOS transistor) is placed in the current path between an IO pad and a receiver.
Figure 3:
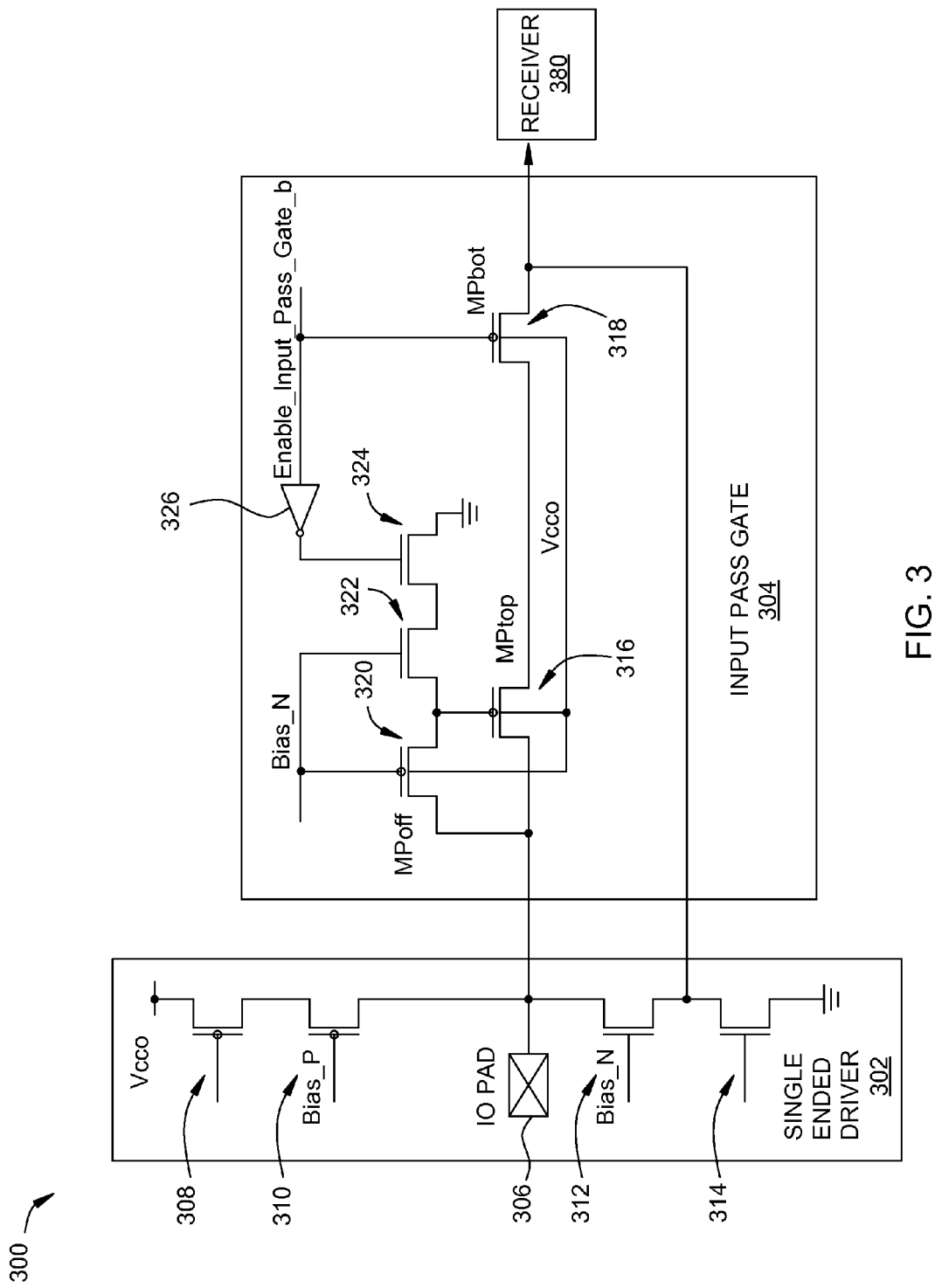
FIG. 3 is a schematic diagram illustrating a portion of one embodiment of an integrated circuit.

FIG. 3 is a schematic diagram illustrating a portion of one embodiment of an input circuit 300. Input circuit 300 can form a portion of an integrated circuit, for example. As illustrated, the input circuit 300 generally comprises a single ended driver 302 coupled with an input pass gate 304.

The single ended driver 302 comprises an IO pad 306, a first PMOS transistor 310, a second PMOS transistor 308, a first NMOS transistor 312, and a second NMOS transistor 314, all coupled in series as shown in FIG. 3. The second PMOS transistor 308 is also coupled directly to a supply voltage (Vcco), while the second NMOS transistor 314 is also coupled directly to ground. The first PMOS transistor 310 is coupled to a bias voltage source Bias_P, while the first NMOS transistor 312 is coupled to a bias voltage source Bias_N.

The input pass gate 304 includes a third PMOS transistor (MPtop) 316 and a fourth PMOS transistor (MPbot) 318, coupled in series between the IO pad and the receiver 380. The input pass gate 304 also includes a fifth PMOS transistor (MPoff) 320, a third NMOS transistor 322, and a fourth NMOS transistor 324 coupled in series. The fifth PMOS transistor 320 is coupled directly to the IO pad 306 of the single ended driver 302, while the fourth NMOS transistor 324 is coupled directly to ground. The gates of the fifth PMOS transistor 320 and the third NMOS transistor 322 are coupled to the same bias voltage source (Bias_N) as the first NMOS transistor 312. The gate of the fourth NMOS transistor 324 is coupled to receive an enable signal selecting between two operating modes, a low voltage mode and a high voltage mode. In the pictured embodiment, the enable signal (Enable_Input_Pass_Gate_b) is provided to a gate terminal of the fourth PMOS transistor (MPbot) and to an input of an inverter 326 The output of inverter 326 is coupled to the gate of the fourth NMOS transistor 324.

In low voltage operation, the single ended driver 302 provides the NMOS transistor portion of a first pass gate, while the input pass gate 304 acts as a PMOS pass gate coupled in parallel with the NMOS transistor. Thus, the NMOS portion of the pass gate is created using existing circuitry (i.e., the single ended driver 302) rather than an additional dedicated pass gate. This combination of transistors is able to support receiving standards in which the voltage (Vpad) at the IO pad 306 ranges up to a first, low voltage threshold (e.g., 1.8V). In high voltage operation, the PMOS pass gate in input pass gate 304 is disabled, and the PMOS portion of the pass gate (i.e., of the "second pass gate") is provided by the first PMOS transistor 310 in the single ended driver 302. The NMOS portion of the second pass gate is still provided by NMOS transistor 312 in single ended driver 302. Thus, the single ended driver 302 and the input pass gate 304 cooperate to support two modes of operation: a low voltage mode (e.g., for LVDS and LVCMOS18/15/12 standards); and a high voltage mode (e.g., for the LVCMOS33 standard).

In the low voltage mode, the third PMOS transistor 316 and the fourth PMOS transistor 318 in the input pass gate 304 are enabled, with their gates at a logical zero. In addition, the first NMOS transistor 312 of the single ended driver 302 is enabled. Thus, in low voltage mode, an input signal is transmitted from the IO pad 306 to the receiver through a pass gate comprising the first NMOS transistor 312 of the single ended driver 302 and the third PMOS transistor 316 and fourth PMOS transistor 318 of the input pass gate 304. As stated above, the gates of the third PMOS transistor 316 and the fourth PMOS transistor are at logical zero, while a bias voltage of Bias_N is applied to the gate of the first NMOS transistor 312. The input signal passes from the IO pad 306 through this pass gate to the receiver. Also while in low voltage mode, the Enable_Input_Pass_Gate_b signal at the input of inverter 326 is coupled to ground.

In the high voltage mode, the third PMOS transistor 316 and the fourth PMOS transistor 318 in the input pass gate 304 are disabled. In addition, the first NMOS transistor 312 and the first PMOS transistor 310 of the single ended driver are enabled. Thus, in high voltage mode, an input signal is transmitted from the IO pad 306 to the receiver using two signals: one signal from the first NMOS transistor 312; and one signal from the first PMOS transistor 310. The data in the two signals is the same, but the voltages are different. In particular, a bias voltage of Bias_P is applied to the gate of second PMOS transistor 310 and prevents the gate to source voltage (Vgs) of the input circuit 300 from exceeding the low voltage threshold (e.g., 1.8V). The signal in the IO pad 306 is thus transmitted to the receiver through the second PMOS transistor 310 (the second PMOS transistor 308, though used in drive mode, is not used in receive mode). Also while in high voltage mode, the Enable_Input_Pass_Gate_b signal at the input of inverter 326 is connected to a bias voltage.

In addition, when the input signal at the IO pad 306 overshoots the supply voltage (Vcco), the entire PMOS pass gate path of the input pass gate 304 is disabled. In this case, a portion of the input signal is carried by the fifth PMOS transistor 320, which pulls the gate of the third PMOS transistor 316 to the voltage of the IO pad 306. Because the gate and the source are at the same voltage, this disables the third PMOS transistor 316. In this case, a bias voltage Bias_N, which is applied at the gate of the first NMOS transistor 312 of the single ended driver 302, is also applied at the gates of the fifth PMOS transistor 320 and the third NMOS transistor 322.

Thus, while the receiver 380 may be designed for use with a low voltage (e.g., 1.8V) technology, the structure illustrated in FIG. 3 permits the receiver to be used with input signals conforming to higher voltage standards (e.g., 3.3V).

Figure 4:
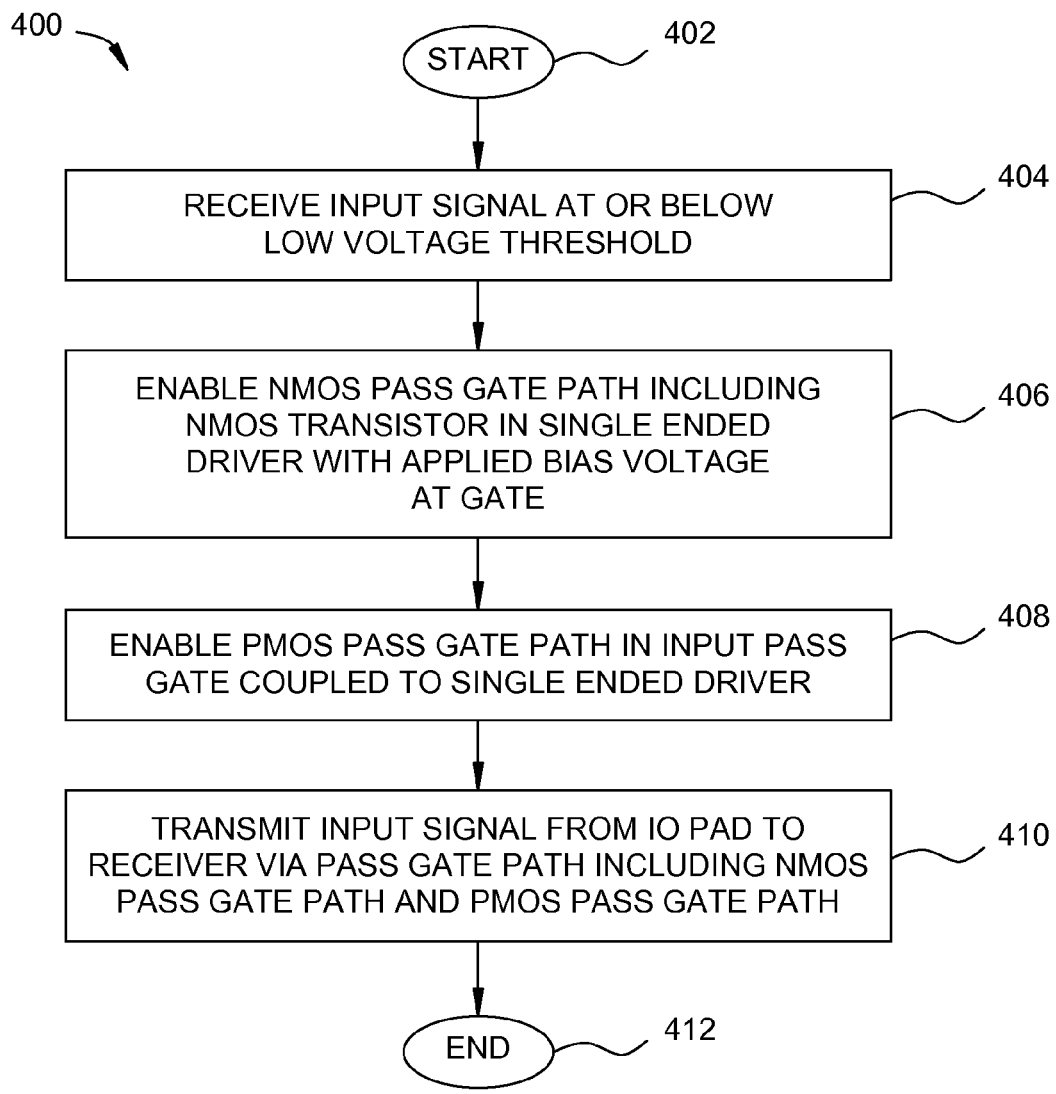
FIG. 4 is a flow diagram illustrating one embodiment of a method for supporting a low voltage signal in a low voltage standard integrated circuit.

FIG. 4 is a flow diagram illustrating one embodiment of a method 400 for supporting a low voltage signal in a low voltage standard integrated circuit. The method 400 may be implemented, for example, in the input circuit 300 illustrated in FIG. 3. In particular, the method 400 may be implemented when the input circuit 300 operates in low voltage mode. As such, reference is made in the discussion of FIG. 4 to various elements of FIG. 3; however, this is not intended to imply that the method 400 cannot be implemented in input circuits having alternative configurations.

The method 400 is initialized at step 402 and proceeds to step 404, where the IO pad 306 receives an input signal that is at or below the low voltage threshold (e.g., 1.8V).

In step 406, an NMOS pass gate path is enabled. In one embodiment, the NMOS pass gate path comprises the first NMOS transistor 312 in the single ended driver 302, which is enabled with an applied bias voltage (Bias_N) at its gate. In step 408, a PMOS pass gate path is also enabled. In one embodiment, the PMOS pass gate path comprises the third PMOS transistor 316 and the fourth PMOS transistor 318 in the input pass gate 304.

In step 410, the input signal is transmitted from the IO pad 306 to the receiver via a pass gate path comprising the NMOS pass gate path and the PMOS pass gate path. The method 400 then terminates in step 412.

Note that the steps illustrated in FIG. 4 may occur in a different order than that shown. For example, the NMOS pass gate path may be enabled (406) and/or the PMOS pass gate path may be enabled (408) prior to receipt of the input signal (404).

In one embodiment, the low voltage operating mode is first selected, e.g., by application of an enable signal, resulting in the enabling of the NMOS and PMOS pass gate paths. The input signal is then received, and is then transmitted from the IO pad to the receiver via both the NMOS and PMOS paths.

Figure 5:
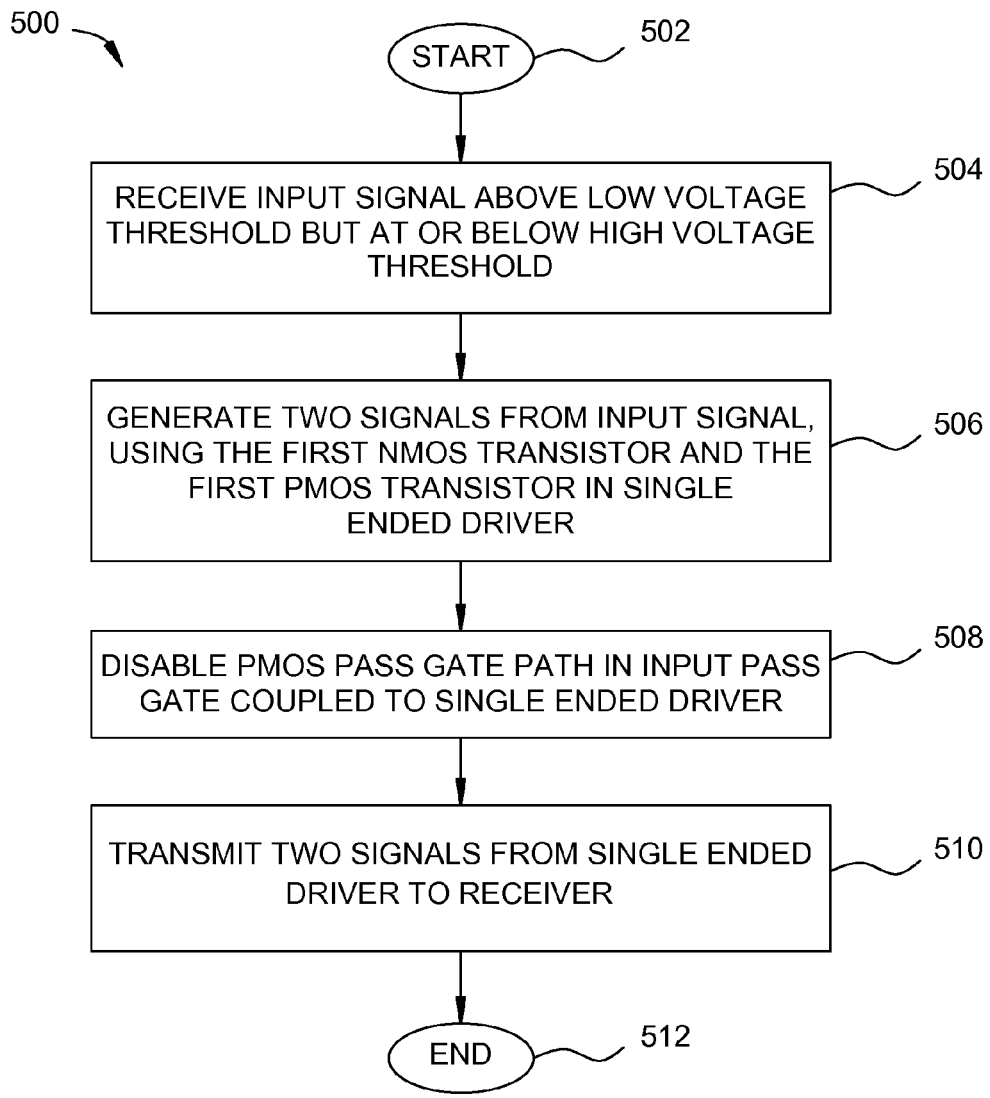
FIG. 5 is a flow diagram illustrating one embodiment of a method for supporting a high voltage signal in a low voltage standard integrated circuit.

FIG. 5 is a flow diagram illustrating one embodiment of a method 500 for transmitting a high voltage signal to a receiver designed using a low voltage technology. The method 500 may be implemented, for example, in the input circuit 300 illustrated in FIG. 3. In particular, the method 500 may be implemented when the input circuit 300 operates in high voltage mode. As such, reference is made in the discussion of FIG. 5 to various elements of FIG. 3; however, this is not intended to imply that the method 500 cannot be implemented in input circuits having alternative configurations.

The method 500 is initialized at step 502 and proceeds to step 504, where the IO pad 306 receives an input signal that is above the low voltage threshold (e.g., 1.8V) but at or below the high voltage threshold (e.g., 3.3V).

In step 506, two signals are generated by the single ended driver 302, in accordance with the input signal: a first signal originating from the first NMOS transistor 312; and a second signal originating from the first PMOS transistor 310. The first and second signals are enabled with applied bias voltages (Bias_N and Bias_P, respectively) at their gates. As discussed above, the data in the first and second signals is the same, but the voltages differ. In step 508, a PMOS pass gate path (e.g., the path through PMOS transistors 316 and 318) is disabled.

In step 510, the two signals are transmitted from the IO pad 306 to the receiver. The method 500 then terminates in step 512.

Note that the steps illustrated in FIG. 5 may occur in a different order than that shown. For example, the PMOS pass gate path may be disabled (508) prior to receipt of the input signal (504). In one embodiment, the high voltage operating mode is first selected, resulting in the disabling of the PMOS pass gate path (508). The input signal is then received (504), the two signals are generated (506), and are then transmitted from the single ended driver to the receiver (510).

While the foregoing describes exemplary embodiments in accordance with one or more aspects of the present disclosure, other and further embodiments in accordance with the one or more aspects of the present disclosure may be devised without departing from the spirit and scope thereof. For example, the single ended driver and input pass gate described herein can form a portion of a differential driver including two single ended drivers respectively coupled to two input pass gates. These and other variations will be clear to those of skill in the relevant arts after review of the present written description and the accompanying figures. Therefore, the spirit and scope of the present invention is determined by the claims that follow and equivalents thereof. Claims listing steps do not imply any order of the steps. Trademarks are the property of their respective owners.

What is claimed is:

1. An integrated circuit, comprising:
a single ended driver coupled to receive an input signal, the single ended driver comprising a first n-type metal-oxide-semiconductor (NMOS) transistor and a first p-type metal-oxide-semiconductor (PMOS) transistor; and
an input pass gate coupled to the single ended driver, the input pass gate being configured as a PMOS pass gate coupled in parallel with the first NMOS transistor,
wherein in a low voltage mode the first NMOS transistor and the PMOS pass gate form a first pass gate for transmitting the input signal to a receiver; and
wherein in a high voltage mode the PMOS pass gate is disabled, and the first NMOS transistor and the first PMOS transistor form a second pass gate for transmitting the input signal to the receiver.

2. The integrated circuit of claim 1, wherein the input signal is received via an input/output (IO) pad integrated in the single ended driver.

3. The integrated circuit of claim 2, wherein:
the single ended driver further comprises:
a second PMOS transistor coupled directly to a supply voltage source; and
a second NMOS transistor coupled directly to ground, and
the second PMOS transistor, the first PMOS transistor, the first NMOS transistor, and the second NMOS transistor are coupled in series.

4. The integrated circuit of claim 3, wherein the first PMOS transistor is coupled to a first bias voltage source.

5. The integrated circuit of claim 4, wherein the first NMOS transistor is coupled to a second bias voltage source.

6. The integrated circuit of claim 2, wherein the input pass gate comprises:
a third PMOS transistor coupled to the IO pad; and
a fourth PMOS transistor coupled between the third PMOS transistor and the receiver.

7. The integrated circuit of claim 6, wherein a gate of the fourth PMOS transistor is coupled to receive an enable signal selecting between the low voltage mode and the high voltage mode.

8. The integrated circuit of claim 6, further comprising:
a fifth PMOS transistor coupled to the IO pad;
a third NMOS transistor; and
a fourth NMOS transistor coupled directly to ground,
wherein the fifth PMOS transistor, the third NMOS transistor, and the fourth NMOS transistor are coupled in series.

9. The integrated circuit of claim 8, wherein the fifth PMOS transistor and the third NMOS transistor are coupled to a second bias voltage source.

10. The integrated circuit of claim 9, wherein a gate of the fourth NMOS transistor is coupled to receive an enable signal selecting between the low voltage mode and the high voltage mode.

11. A method for transmitting an input signal through an input circuit from an input/output (IO) pad to a receiver, the method comprising:
receiving the input signal at the IO pad, wherein the IO pad is integrated in a single ended driver;

in response to an enable signal specifying a high voltage transmission mode:
  transmitting the input signal from the IO pad to the receiver via a first signal path through the input circuit; and
  disabling a second signal path through the input circuit that is coupled in parallel with the first signal path;
in response to the enable signal specifying a low voltage transmission mode:
  enabling the second signal path through the input circuit; and
  transmitting the input signal from the IO pad to the receiver via the first and second signal paths;
wherein the first signal path comprises a pass gate integrated into the single ended driver.

12. The method of claim 11, wherein:
the receiver is designed using a 1.8V technology; and
the input signal exceeds 1.8V.

13. The method of claim 11, wherein the pass gate comprises an n-type metal-oxide-semiconductor (NMOS) transistor and a p-type metal-oxide semiconductor (PMOS) transistor.

14. The method of claim 13, wherein the single ended driver comprises the NMOS transistor and the PMOS transistor each having a source/drain coupled to the IO pad.

15. The method of claim 11, wherein:
the receiver is designed using a 1.8V technology; and
the input signal does not exceed 1.8V.

* * * * *